(12) United States Patent  (10) Patent No.: US 8,242,349 B2
Carroll                    (45) Date of Patent:    Aug. 14, 2012

(54) PLANAR SOLAR CONCENTRATOR

(75) Inventor: Joseph P. Carroll, Moorpark, CA (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 610 days.

(21) Appl. No.: 12/145,663

(22) Filed: Jun. 25, 2008

(65) Prior Publication Data

US 2009/0320900 A1    Dec. 31, 2009

(51) Int. Cl.
*H01L 31/042*  (2006.01)
*H01L 31/00*   (2006.01)
*F24J 2/00*    (2006.01)
*F24J 2/46*    (2006.01)
*B64G 1/22*    (2006.01)
*B64G 1/44*    (2006.01)
*B64G 1/00*    (2006.01)

(52) U.S. Cl. ........ 136/246; 126/569; 126/571; 126/600; 244/172.6; 244/172.7; 244/172.8; 244/173

(58) Field of Classification Search .......... 136/246; 126/569, 571, 600; 244/172.6, 172.7, 172.8, 244/173
See application file for complete search history.

(56) References Cited

U.S. PATENT DOCUMENTS

| 3,372,396 | A |   | 3/1968  | Braccini |
|-----------|---|---|---------|----------|
| 3,509,576 | A |   | 4/1970  | McLain |
| 3,576,566 | A |   | 4/1971  | Cover |
| 4,134,387 | A |   | 1/1979  | Tornstrom |
| 4,282,394 | A | * | 8/1981  | Lackey et al. ............... 136/245 |
| 4,466,423 | A | * | 8/1984  | Dolan et al. ................ 126/571 |
| 4,690,355 | A | * | 9/1987  | Hornung et al. .......... 244/172.8 |
| 4,762,298 | A | * | 8/1988  | Wood .......................... 248/179.1 |
| 4,845,511 | A |   | 7/1989  | Grayson |
| 5,244,508 | A |   | 9/1993  | Colozza |
| 5,347,402 | A | * | 9/1994  | Arbogast .................... 359/853 |
| 5,496,414 | A |   | 3/1996  | Harvey |
| 5,520,747 | A |   | 5/1996  | Marks |
| 5,542,409 | A | * | 8/1996  | Sampayo ..................... 126/606 |
| 5,578,139 | A |   | 11/1996 | Jones |
| 5,885,367 | A |   | 3/1999  | Brown |
| 6,075,200 | A |   | 6/2000  | O'Neill |
| 6,188,012 | B1|   | 2/2001  | Ralph |
| 6,421,998 | B1|   | 7/2002  | Frye |
| 6,557,804 | B1|   | 5/2003  | Carroll |
| 6,886,339 | B2|   | 5/2005  | Carroll |
| 7,003,941 | B2|   | 2/2006  | Frye |
| 7,138,960 | B2|   | 11/2006 | Carroll |
| 7,380,549 | B1| * | 6/2008  | Ratliff ........................ 126/605 |

* cited by examiner

*Primary Examiner* — Basia Ridley
*Assistant Examiner* — Allison Bourke
(74) *Attorney, Agent, or Firm* — Carlson, Gaskey & Olds, PC

(57) ABSTRACT

A solar concentrator includes a plurality of separate panels positioned between opposed support rods. Tension elements extend between the support rods and mount the plurality of panels.

15 Claims, 3 Drawing Sheets

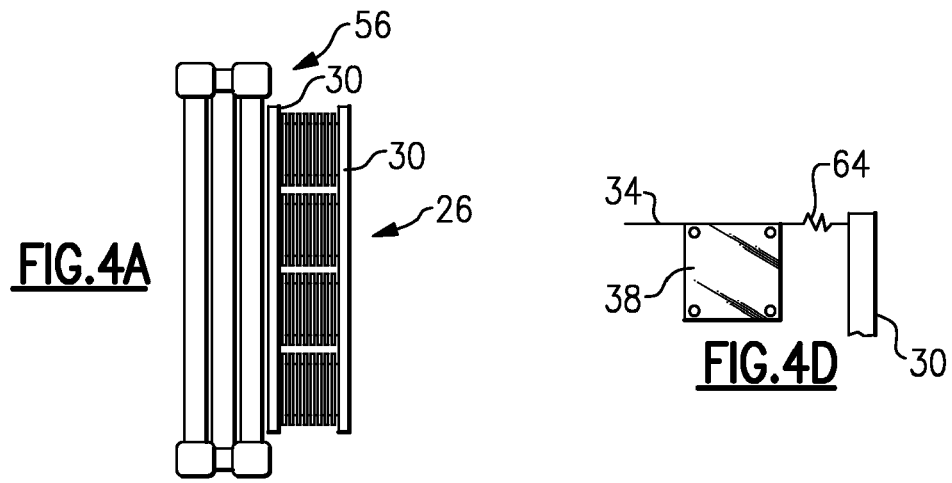
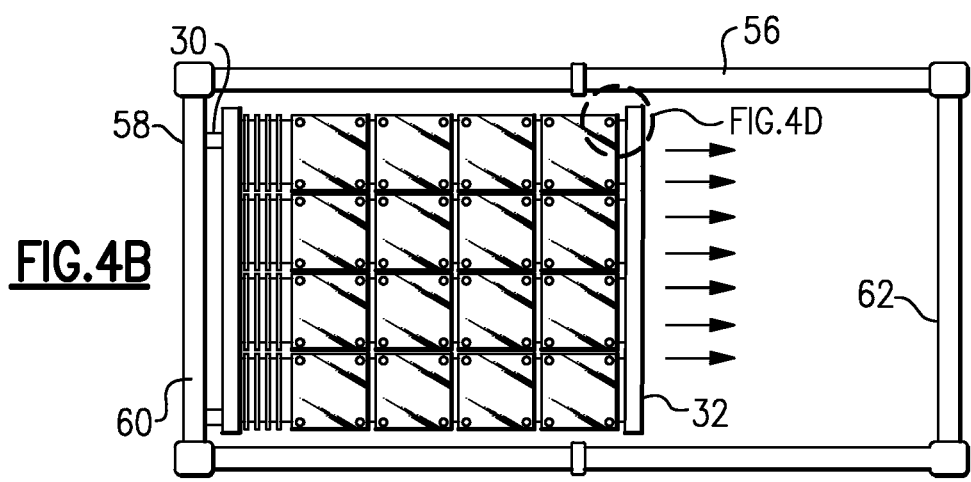
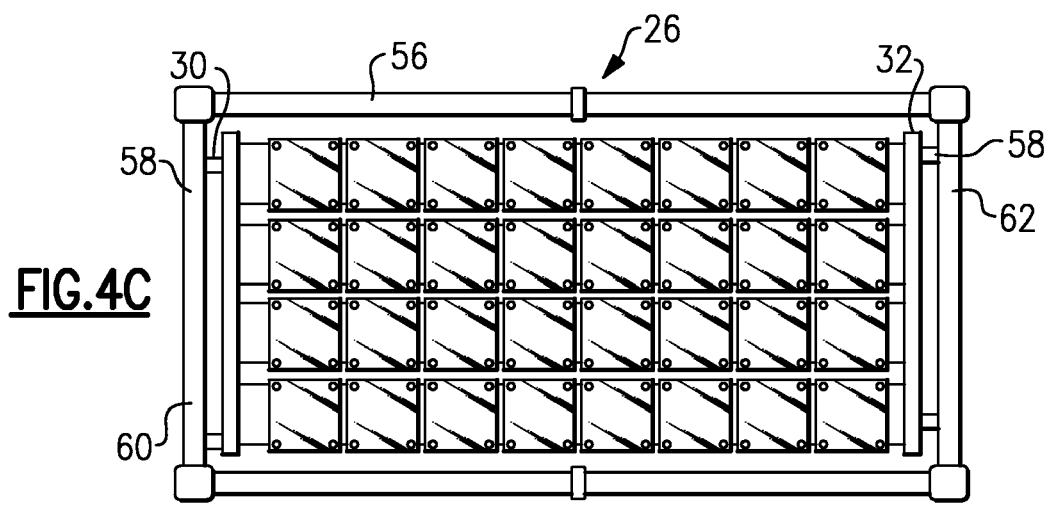

PLANAR SOLAR CONCENTRATOR

BACKGROUND OF THE INVENTION

This application relates to a solar concentration that is movable between a stowed position and a deployed position, and in which the solar concentrator includes a number of separate panels that may be positioned at distinct orientations relative to each other.

Solar concentrators are utilized to provide a source of energy on remote applications, such as on satellites in space. One challenge to the development of solar concentrators is that the solar concentrator must be stowed in a small space during deployment of the satellite. Thus, solar concentrators are typically provided with a number of assemblies and orientations which allow them to be packaged in their stowed orientation, and then deployed to their extended position.

To date, the proposed assemblies for moving the solar concentrator between the two positions have had deficiencies, and have provided insufficient control over the exact position of the plurality of panels incorporated into the solar concentrator.

SUMMARY OF THE INVENTION

A solar concentrator is movable between a stowed position and an extended position. The solar concentrator includes a plurality of separate panels which are mounted on tension elements. In disclosed embodiments of this invention, the relative location of the panels can be individually adjusted so that the solar energy can be focused on an associated solar cell.

These and other features of the present invention can be best understood from the following specification and drawings, the following of which is a brief description.

BRIEF DESCRIPTION OF THE DRAWINGS

FIG. 4A shows a stowed solar concentrator.

FIG. 4B shows a first step in the deployment of the FIG. 4A concentrator.

FIG. 4C shows the fully deployed concentrator.

FIG. 4D shows a feature of one portion of the solar concentrator.

DETAILED DESCRIPTION OF THE PREFERRED EMBODIMENT

Figure 1:
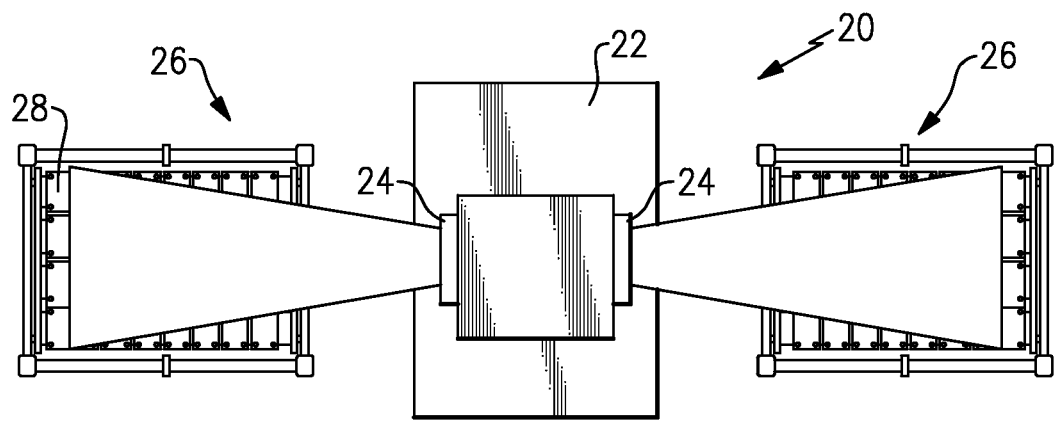
FIG. 1 is a schematic view of the satellite incorporating the present invention.

FIG. 1 shows a satellite 20, having a satellite body 22, and a solar cell array 24 for providing power to the satellite 22. The solar cell array 24 may include photovoltaic solar cells, or other appropriate solar power generating devices.

As shown, solar concentrators 26 are positioned adjacent to the cell array 24, and concentrate captured solar energy onto the cells 24.

Figure 2:
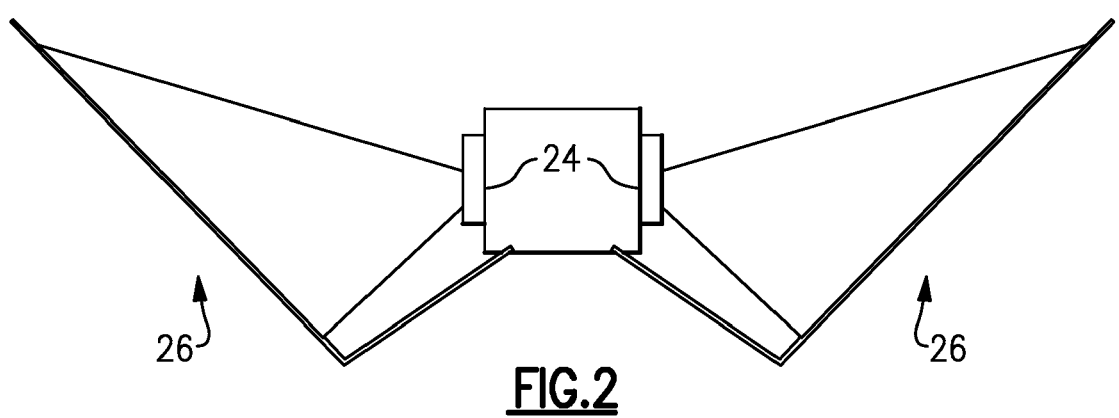
FIG. 2 is a second view of the FIG. 1 satellite.

As can be appreciated from FIGS. 1 and 2, the concentrator focuses the area of the reflector down to a smaller area at the solar cell array 24. That is, the area of the concentrator is larger in all three dimensions than the size of the concentrated reflective solar energy at the solar cell array 24.

Figure 3A:
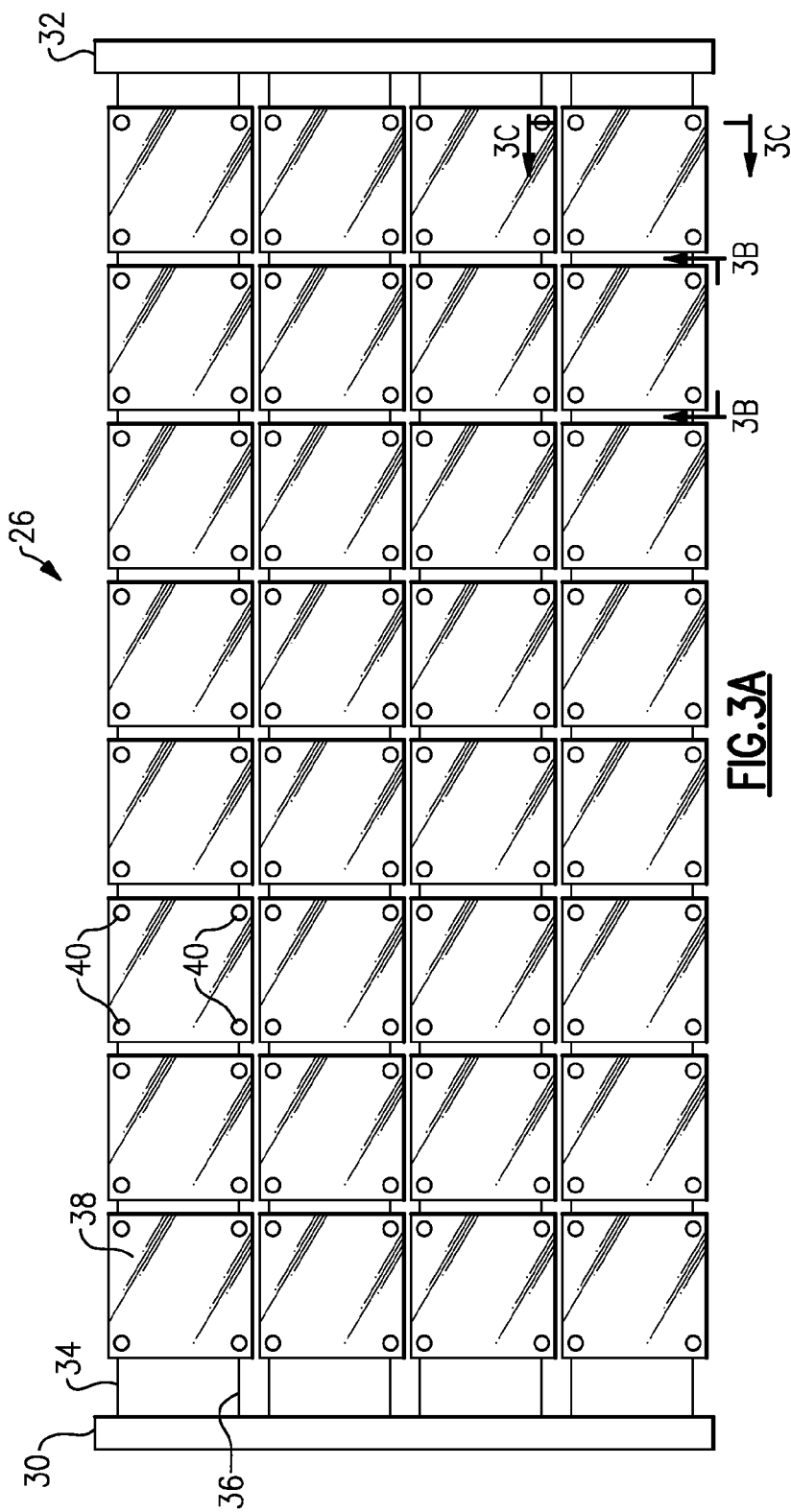
FIG. 3A is a front view of a portion of a solar concentrator.

As shown in FIG. 3A, the concentrator 26 includes spaced support rods 30 and 32. Tension elements or strings 34 and 36 pass through each of a plurality of reflector facets or panels 38. Tilt or mount buttons 40 are positioned on the tension strings 34 and 36 at each of four corners of each of the panels 38. The panels 38 may be formed of some appropriate reflective material.

Figure 3C:
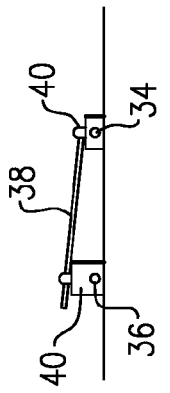
FIG. 3C is a partial cross-sectional view along line 3C-3C of FIG. A.
Figure 3B:
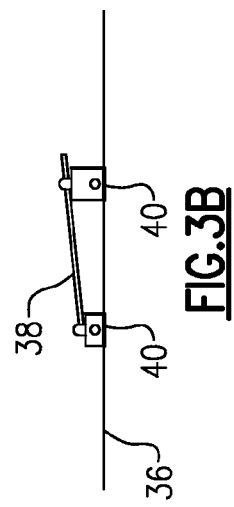
FIG. 3B is a partial section along line 3B-3B of FIG. 3A.

As can be appreciated in FIGS. 3B and 3C, the buttons 40 allow each of the panels 38 to be tilted in an appropriate direction to provide the concentration or focus as explained above with regard to FIGS. 1 and 2. That is, each of the panels may be angled with regard to the solar cell array 24 at an appropriate orientation to provide the focus. Stated another way, each panel 38 may be positioned at different angles relative to the other panels 38 to provide a desired focus. By selecting the appropriate size of the buttons 40, the panels 38 can each be positioned at distinct locations relative to each other to provide the focus. At the same time, the tension springs 34 and 36 at the opposed ends of the panels 38 provide a planar base that provides a reference surface for properly positioning the panels.

As shown in FIG. 4A, the concentrator 26 begins in a stowed position when the satellite is deployed. A frame 56 is also stowed along with the concentrator 26.

As shown in FIG. 4B, the frame 56 is deployed in any of several known manners. A robotic element then attaches one of the support rods 30 to an end 60 of the frame 56. As shown in FIG. 3C, the opposed support rod 32 is then pulled to end 62.

FIG. 4D shows one further feature. Tension strings 34 and 36 are provided with a spring 64. By utilizing the spring 64 on each of the tension strings, variations in the length of the strings 34 and 36 will not effect the positioning of the panels 38 relative to each other. Instead, the spring 64 will ensure that each of the strings are in tension regardless of whether any one of the strings is slightly shorter or longer than the others.

As can be appreciated from the figures, the panels 38 are mounted in a plurality of rows, each associated with separate set of tension springs 34 and 36. Also, in each row, there are a plurality of columns of panels 38 spaced between the support rods 30 and 32. The tension strings 34 and 36 can be formed of an appropriate material which is capable of withstanding deployment in the intended environment.

While the solar concentrator is disclosed for use with a solar cell array, it may also be utilized with other generation elements that rely upon solar energy to generate energy. Examples would be Stirling or Brayton engines, or thermoelectric materials.

Although an embodiment of this invention has been disclosed, a worker of ordinary skill in this art would recognize that certain modifications would come within the scope of this invention. For that reason, the following claims should be studied to determine the true scope and content of this invention.

What is claimed is:

1. A solar concentrator comprising:
a plurality of separate panels positioned between opposed support rods;
tension elements extending between said support rods and mounting said plurality of panels;
said panels being positioned relative to said tension elements at selected orientations, and such that at least one of said panels may be positioned at different angles relative to others of said panels to provide a desired focus of reflected solar energy;

said support rods are movable toward each other, with said panels and said tension elements collapsing to provide a stowed position for said solar concentrator;

one of said support rods being moveable away from the other to cause said tension elements to extend, and move said panels to a deployed position; and a frame being positioned outwardly of the solar concentrator, and said support rods being connected to ends of said frame, and one of said support rods moving from the stowed position to the deployed position and then being connected to said support frame.

2. The solar concentrator as set forth in claim 1, wherein there are a plurality of rows of said tension elements.

3. The solar concentrator as set forth in claim 1, wherein each of said panels has a first and a second tension element mounted at opposed sides of said panels.

4. The solar concentrator as set forth in claim 1, wherein said tension elements are provided with buttons that mount said panels to said tension elements, and said buttons being sized to provide said different angles for said at least one of said panels relative to the others of said panels.

5. The solar concentrator as set forth in claim 4, wherein said buttons are provided on said tension elements, at each of four corners of each of the panels, and said buttons having selected lengths to provide the different angles of said at least one of said panels relative to the others of said panels.

6. The solar concentrator as set forth in claim 1, wherein said tension elements include a spring to ensure that each of said tension elements are held in tension in the solar concentrator.

7. The solar concentrator as set forth in claim 1, wherein there are a plurality of rows of said tension elements, and each of said panels has a first and a second tension element mounted at opposed sides of said panels, said tension elements are provided with buttons that mount said panels to said tension elements, and said buttons being sized to provide said different angles for said at least one of said panels relative to the others of said panels, said tension elements include a spring to ensure that each of said tension elements are held in tension in the solar concentrator, said buttons are provided on said tension elements, at each of four corners of each of the panels, and said buttons having selected lengths to provide the different angles of said at least one of said panels relative to the others of said panels.

8. A generation system comprising:
a generation element that generates energy from solar energy;
a solar concentrator for said generation element;
the solar concentrator including a plurality of panels positioned between opposed support rods;
tension elements extending between said support rods and mounting said plurality of panels;
said panels being positioned relative to said tension elements at selected orientations, and such that at least one of said panels may be positioned at different angles relative to others of said panels to provide a desired focus of reflected solar energy toward the generation element in a deployed position;
said support rods are movable toward each other, with said panels and said tension elements collapsing to provide a stowed position for said solar concentrator; and
a frame being positioned outwardly of the solar concentrator, and said support rods being connected to ends of said frame, and one of said support rods moving from the stowed position to the deployed position and then being connected to said support frame.

9. The system as set forth in claim 8, wherein there are a plurality of rows of said tension elements.

10. The system as set forth in claim 8, wherein each of said panels has a first and a second tension element mounted at opposed sides of said panels.

11. The system as set forth in claim 8, wherein said tension elements are provided with buttons that mount said panels to said tension elements, and said buttons being sized to provide said different angles for said at least one of said panels relative to the others of said panels.

12. The system as set forth in claim 11, wherein said buttons are provided on said tension elements, at each of four corners of each of the panels, and said buttons having selected lengths to provide the different angles of said at least one of said panels relative to the others of said panels.

13. The system as set forth in claim 8, wherein said tension elements include a spring to ensure that each of said tension elements are held in tension in the solar concentrator.

14. The system as set forth in claim 8, wherein said generation element is a solar cell array.

15. The system as set forth in claim 8, wherein there are a plurality of rows of said tension elements, each of said panels has a first and a second tension element mounted at opposed sides of said panels, said tension elements are provided with buttons that mount said panels to said tension elements, and said buttons being sized to provide said different angles for said at least one of said panels relative to the others of said panels, said tension elements include a spring to ensure that each of said tension elements are held in tension in the solar concentrator.

* * * * *